(12) United States Patent
Oh et al.

(10) Patent No.: US 11,302,540 B2
(45) Date of Patent: Apr. 12, 2022

(54) SUBSTRATE SUPPORT DEVICE AND SUBSTRATE CLEANING DEVICE INCLUDING THE SAME

(71) Applicant: SAMSUNG ELECTRONICS CO., LTD., Suwon-si (KR)

(72) Inventors: Jong keun Oh, Hwaseong-si (KR); Kyeong bin Lim, Gyeonggi-do (KR); Byung gook Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 496 days.

(21) Appl. No.: 16/019,762

(22) Filed: Jun. 27, 2018

(65) Prior Publication Data
US 2019/0221451 A1    Jul. 18, 2019

(30) Foreign Application Priority Data
Jan. 15, 2018 (KR) .................. 10-2018-0004921

(51) Int. Cl.
| H01L 21/67 | (2006.01) |
| H01L 21/02 | (2006.01) |
| B08B 3/02 | (2006.01) |
| B08B 3/12 | (2006.01) |
| H01L 21/687 | (2006.01) |
| B08B 7/02 | (2006.01) |
| G06F 1/00 | (2006.01) |

(52) U.S. Cl.
CPC .......... *H01L 21/67051* (2013.01); *B08B 3/02* (2013.01); *B08B 3/12* (2013.01); *B08B 7/02* (2013.01); *G06F 1/00* (2013.01); *H01L 21/02057* (2013.01); *H01L 21/68728* (2013.01); *H01L 21/68764* (2013.01); *B08B 2203/0288* (2013.01)

(58) Field of Classification Search
CPC ......... H01L 21/68764; H01L 21/02057; H01L 21/68728; H01L 21/67051; G06F 1/00; B08B 3/12; B08B 7/02; B08B 3/02; B08B 2203/0288
See application file for complete search history.

(56) References Cited

U.S. PATENT DOCUMENTS

| 5,531,862 A * | 7/1996 | Otsubo ................. C23C 14/564 |
| | | 438/798 |
| 6,039,059 A * | 3/2000 | Bran ....................... B08B 17/02 |
| | | 134/105 |
| 6,554,003 B1 * | 4/2003 | Birang .................... B08B 3/12 |
| | | 134/1.3 |

(Continued)

FOREIGN PATENT DOCUMENTS

| JP | 2000-031022 A | 1/2000 |
| JP | 2008-098561 A | 4/2008 |

(Continued)

*Primary Examiner* — Benjamin L Osterhout
(74) *Attorney, Agent, or Firm* — Lee IP Law, P.C.

(57) ABSTRACT

A support device for a substrate and a substrate cleaning apparatus, the support device including a support on which the substrate is loadable; a rotor that rotates the support; and an oscillator that oscillates the substrate in a direction perpendicular to a surface of the substrate, wherein the substrate oscillates according to a natural frequency of the substrate or a natural frequency of particles on the substrate.

18 Claims, 5 Drawing Sheets

(56) References Cited

U.S. PATENT DOCUMENTS

| | | | |
|---|---|---|---|
| 2001/0009155 A1* | 7/2001 | Matsuno | B08B 3/12 134/2 |
| 2002/0029788 A1* | 3/2002 | Verhaverbeke | B08B 3/02 134/1.3 |
| 2002/0063169 A1* | 5/2002 | Verhaverbeke | H01L 21/67051 239/436 |
| 2002/0064961 A1* | 5/2002 | Verhaverbeke | H01L 21/6708 438/704 |
| 2002/0066475 A1* | 6/2002 | Verhaverbeke | H01L 21/68728 134/153 |
| 2003/0037457 A1* | 2/2003 | Bailey | H01L 21/6875 34/232 |
| 2003/0040193 A1* | 2/2003 | Bailey | H01L 21/67017 438/710 |
| 2003/0045098 A1* | 3/2003 | Verhaverbeke | H01L 21/67225 438/689 |
| 2004/0009740 A1* | 1/2004 | Verhaverbeke | B24B 41/067 451/42 |
| 2004/0152319 A1* | 8/2004 | Yamagata | C30B 33/00 438/689 |
| 2005/0003737 A1* | 1/2005 | Montierth | A61B 8/546 451/5 |
| 2006/0260642 A1* | 11/2006 | Verhaverbeke | B08B 3/12 134/1.3 |
| 2006/0260660 A1 | 11/2006 | Verhaverbeke et al. | |
| 2007/0068558 A1* | 3/2007 | Papanu | G03F 1/82 134/29 |
| 2007/0084481 A1* | 4/2007 | Franklin | H01L 21/02071 134/1.3 |
| 2008/0230092 A1* | 9/2008 | Ko | B08B 3/024 134/36 |
| 2010/0258142 A1* | 10/2010 | Kawaguchi | H01L 21/02057 134/1.3 |
| 2013/0333722 A1 | 12/2013 | Tanaka | |
| 2015/0144164 A1 | 5/2015 | Ishibashi | |
| 2015/0273537 A1* | 10/2015 | Miya | B08B 3/12 134/30 |
| 2016/0136775 A1 | 5/2016 | Shinozaki | |
| 2016/0254170 A1* | 9/2016 | Hu | B08B 3/102 134/1.3 |

FOREIGN PATENT DOCUMENTS

| | | |
|---|---|---|
| JP | 2011-071198 A | 4/2011 |
| JP | 5276559 B2 | 8/2013 |
| KR | 10-2001-0048187 A | 6/2001 |
| KR | 10-2006-0042274 A | 5/2006 |

\* cited by examiner (a)  (b)

(a)  (b)

(a)  (b)

(a)  (b)

SUBSTRATE SUPPORT DEVICE AND SUBSTRATE CLEANING DEVICE INCLUDING THE SAME

CROSS-REFERENCE TO RELATED APPLICATION

Korean Patent Application No. 10-2018-0004921, filed on Jan. 15, 2018, in the Korean Intellectual Property Office (KIPO), and entitled: "Substrate Support Mechanism and Substrate Cleaning Device Including the Same," is incorporated by reference herein in its entirety.

BACKGROUND

1. Field

Embodiments relate to a substrate support device and a substrate cleaning apparatus including the same.

2. Description of the Related Art

A substrate cleaning operation may be performed in a semiconductor device manufacturing process, e.g., in process of manufacturing a mask a wafer, and the like with a circuit pattern formed thereon.

SUMMARY

The embodiments may be realized by providing a support device for a substrate, the device including a support on which the substrate is loadable; a rotor that rotates the support; and an oscillator that oscillates the substrate in a direction perpendicular to a surface of the substrate, wherein the substrate oscillates according to a natural frequency of the substrate or a natural frequency of particles on the substrate.

The embodiments may be realized by providing a substrate cleaning apparatus including a substrate support device on which a substrate is supportable; a cleaning chamber that provides a space in which the substrate support device is accommodated; and a cleaning solution jet that sprays a cleaning solution toward the substrate, wherein the substrate support device includes a support on which the substrate is loadable; a rotor that rotates the support; and an oscillator that oscillates the substrate in a direction perpendicular to a surface of the substrate according to a natural frequency of the substrate or a natural frequency of particles on the substrate.

The embodiments may be realized by providing a substrate cleaning apparatus including a substrate support device on which a substrate is supportable; a cleaning chamber that provides a space in which the substrate support device is accommodated; and a megasonic device that provides a cleaning solution including micro-cavitation toward the substrate, wherein the substrate support device includes a support on which the substrate is loadable; a rotor that rotates the support; and an oscillator that oscillates the substrate in a direction perpendicular to a surface of the substrate according to a natural frequency of the substrate or a natural frequency of particles on the substrate.

BRIEF DESCRIPTION OF THE DRAWINGS

Features will be apparent to those of skill in the art by describing in detail exemplary embodiments with reference to the attached drawings in which.

Figure 6:
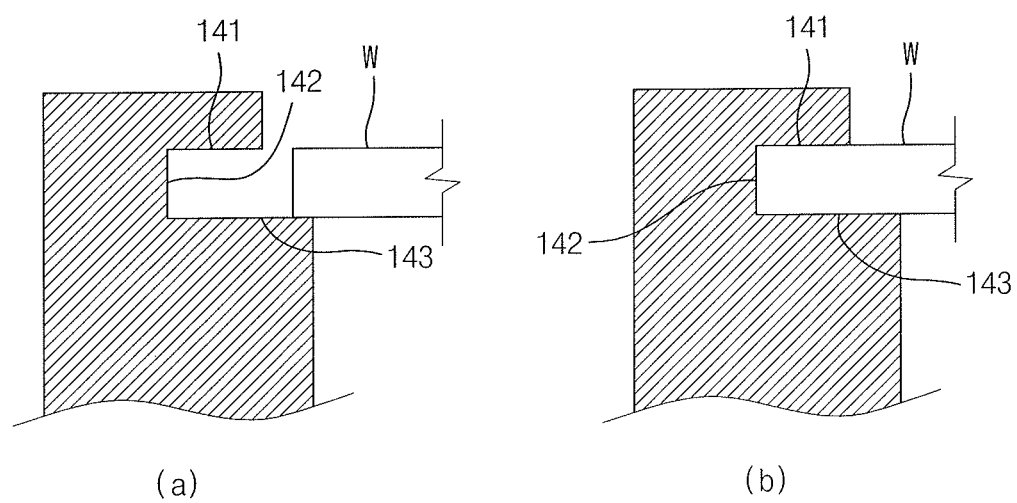
Figure 7:
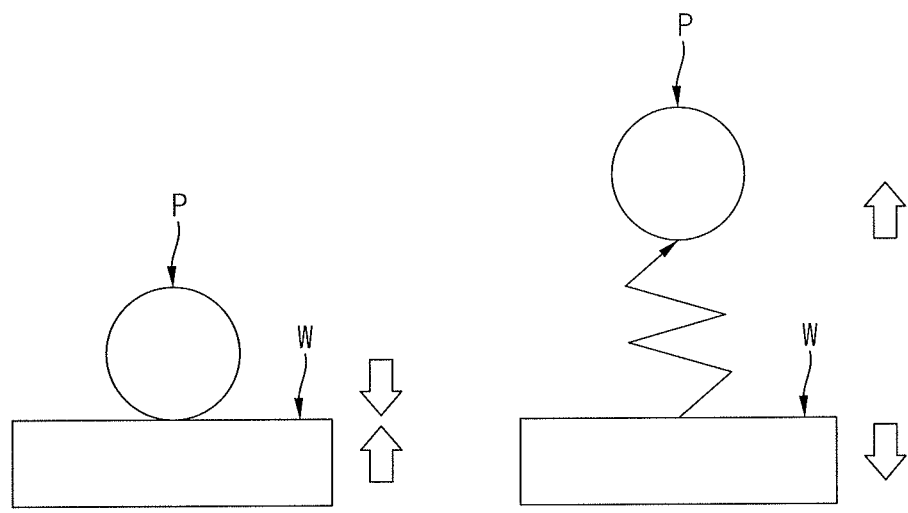
Figure 8:
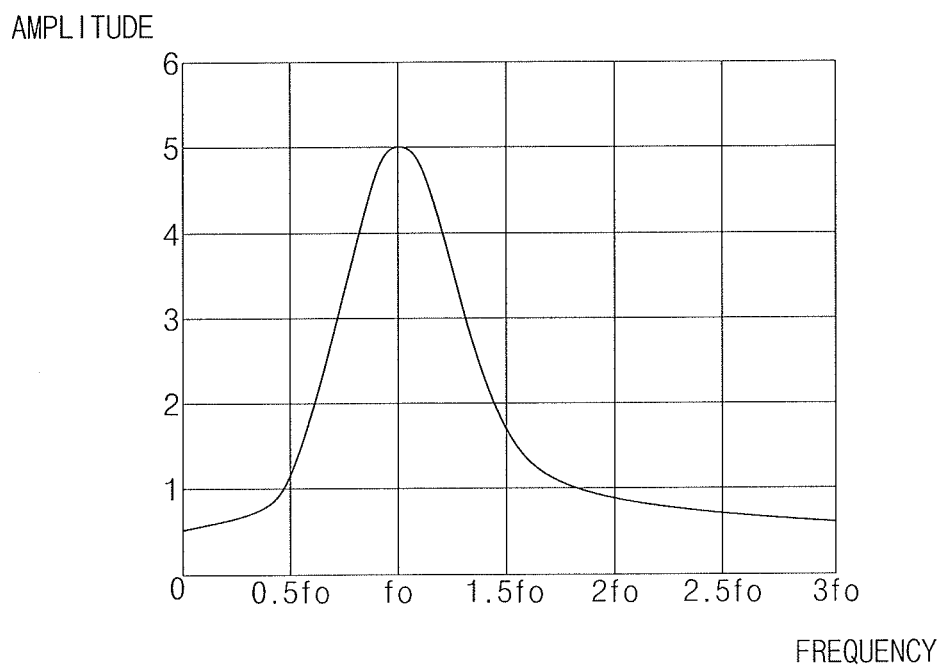
Figure 9:
Figure 10:
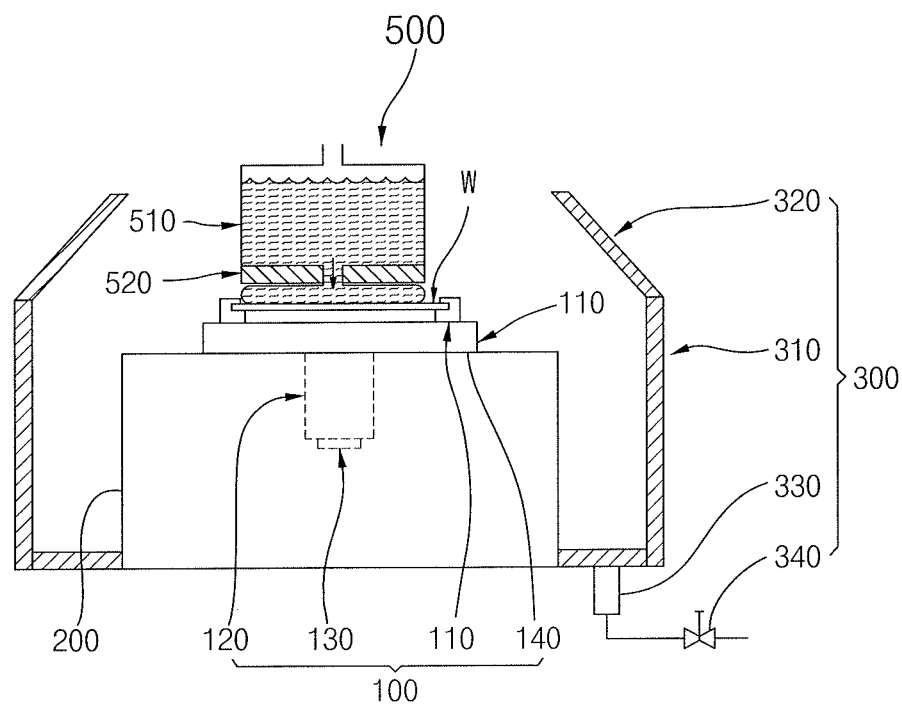

parts (a) of FIGS. 2 to 5 illustrate side cross-sectional views of a substrate support device according to an exemplary embodiment, and parts (b) of FIGS. 2 to 5 illustrate top views of the substrate support device according to an exemplary embodiment;

FIG. 6 illustrates side cross-sectional views of a fixer according to an exemplary embodiment;

FIG. 7 illustrates views briefly showing movements of a substrate and particles during oscillation according to an exemplary embodiment;

FIG. 8 illustrates a graph showing amplitude of oscillation according to frequency according to an exemplary embodiment;

FIG. 9 illustrates a view of a bending rate of a substrate when oscillations of resonance frequencies are applied to the substrate according to an exemplary embodiment; and FIG. 10 illustrates a side cross-sectional view of a substrate cleaning apparatus according to an exemplary embodiment.

DETAILED DESCRIPTION

Figure 1:
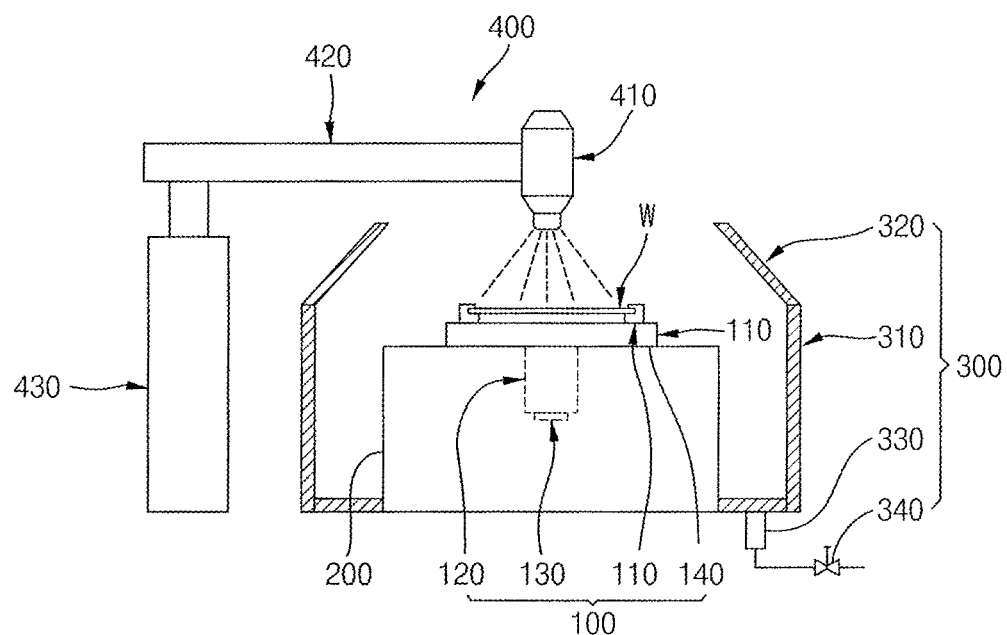
FIG. 1 illustrates a side cross-sectional view of a substrate cleaning apparatus according to an exemplary embodiment.

FIG. 1 illustrates a cross-sectional view of a substrate cleaning apparatus according to an exemplary embodiment.

Referring to FIG. 1, a substrate cleaning apparatus according to an exemplary embodiment may include a substrate support device 100, a housing 200, a cleaning solution jet 400, and a cleaning chamber 300.

The substrate support device 100 may support a substrate W and may include a support 110, a rotor 120, an oscillator 130, and a fixer 140.

The substrate W may be a mask or a wafer in a manufacturing process. The substrate W may have a circular plane shape. In an implementation, the substrate W may be a quartz substrate and may include silicon oxide ($SiO_2$).

A micro circuit pattern may be formed on a surface of the substrate W. The micro circuit pattern may be formed to be perpendicular to the substrate W. For example, the micro circuit pattern may be formed on a major surface of the substrate W (e.g., such that the micro circuit pattern may be viewable in plan view perpendicular or orthogonal to the major surface of the substrate W).

Particles P (see FIG. 7) may be located between the circuit patterns formed on the substrate W. The particles P may be a by-produce of a manufacturing process, e.g., the particles P may be particles P generated during a development process or particles P generated during a process of etching a film to be subjected to masking. The particles P may include $SiO_2$. The particles P may act as a cause of a defect of a mask or a wafer. For example, particles P continuously remaining on the surface of the substrate W may have a negative influence on a subsequent operation.

The support 110 may provide a space for loading the substrate W. The support 110 may load the substrate W in a form of arrangement in which a center of the support 110 and a center of the substrate W are perpendicularly aligned with each other. One surface (e.g., a top surface) of the support 110 may face the substrate W. Another surface (e.g., a bottom surface) of the support 110 may come into contact with the rotor 120. The fixer 140 (which mounts and fixes the substrate W) may be formed on or at an edge of the one surface of the support 110.

In an implementation, the support 110 may be located on a center of an outside of the housing 200, as shown in FIG. 1. In an implementation, the support 110 may be accommodated in the housing 200. In an implementation, the support 110 may be any one of, e.g., an electrostatic chuck, a stage, and a frame. The support 110 may have a circular plane shape corresponding to the shape of the substrate W.

The rotor 120 may rotate the support 110. In an implementation, the support 110 may be rotated at about 60 rpm to about 1,000 rpm. In an implementation, the rotor 120 may further include a motor and a driver that controls driving of the motor. A rotating force caused by rotation of the motor may be transferred to the substrate W through the support 110. Resultantly, the rotor 120 may rotate the substrate W.

The rotor 120 may rotate the support 110 about a rotation axis A. The rotation axis A may pass through the center of the substrate W or may pass through the center of the substrate W and the center of the support 110 simultaneously.

When the support 110 is rotated about the rotation axis A by the rotor 120, a centrifugal force may occur at the substrate W. A cleaning solution jetted or sprayed toward the center of the substrate W may be moved from the center of the substrate W to an edge of the substrate W by the centrifugal force. The movement of the cleaning solution by the centrifugal force may help remove the particles P located on the surface of the substrate W.

The oscillator 130 may oscillate the substrate W. An oscillation direction of the substrate W may be a direction perpendicular to the (e.g., major) surface of the substrate W. The oscillation direction may be parallel to the rotation axis A. The rotation axis A may be positioned at a center of the oscillator 130, and thus the oscillator 130 may be positioned on the rotation axis A.

The oscillator 130 may include at least one piezoelectric element. In an implementation, the piezoelectric element may include, e.g., lead zirconate titanate (PZT) as a piezoelectric ceramic that generates mechanical oscillations when a voltage is applied.

The oscillator 130 may oscillate the substrate W according to a natural frequency of the substrate W or may oscillate the substrate W according to a natural frequency of the particles P.

When the substrate W oscillates at the natural frequency, a contact area between the surface of the substrate W and the particles P may be reduced. When the contact area is reduced, adhesion between the substrate W and the particles P may be reduced. The particles P with reduced adhesion may be easily removed by the cleaning solution that moves toward the edge of the substrate W. For example, the oscillator 130 may oscillate the substrate W at a frequency that is selected in order to dislodge the particles P from the substrate W. The frequency at which the particles P are most effectively dislodged from the substrate W may be selected according to a property of the substrate W or a property of the particles P.

The fixer 140 may mount and fix the substrate W. A plurality of such fixers 140 may be formed on or at the edge of the support 110. The plurality of fixers 140 may be arranged according to a size of the substrate W. In an implementation, the plurality of fixers 140 may be arranged at locations corresponding to a perimeter of the substrate W. The fixer 140 may help prevent the rotating or oscillating substrate W from being separated from the support 110. In an implementation, the fixer 140 may be a clamp or may have a pin shape.

The housing 200 may provide a space that accommodates the substrate support device 100. In an implementation, the motor and the motor driver of the rotor 120 may be accommodated and the controller that controls driving of the oscillator 130 may be accommodated therein. In an implementation, as shown in FIG. 1, the rotor 120 and the oscillator 130 may be accommodated in the housing 200. In an implementation, the support 110 may also be accommodated in the housing 200.

The housing 200 may protect the substrate support device 100 from an external impact. The housing 200 may help prevent a cleaning solution from flowing into and damaging the rotor 120 or the oscillator 130.

The cleaning solution jet 400 may jet or spray a cleaning solution toward the substrate W. The cleaning solution jet 400 may include a jet arm 420, a jet nozzle 410, and a jet rod 430. The cleaning solution jet 400 may be disposed to be contiguous to the cleaning chamber 300.

The jet nozzle 410 may directly spray the cleaning solution toward the center of the substrate W. The jet nozzle 410 may perpendicularly face the center of the substrate W. Accordingly, the jet nozzle 410 may be positioned on the rotation axis A. The jet nozzle 410 may be formed at one end of the jet arm 420. For example, when the jet arm 420 horizontally moves, the jet nozzle 410 may accordingly move horizontally as well. When the jet arm 420 perpendicularly moves, the jet nozzle 410 may also perpendicularly move. The jet position of the nozzle 410 may be adjusted as necessary.

The jet nozzle 410 may spray the cleaning solution in a certain pattern as desired. The certain pattern may include, e.g., a cone shape, a fan shape, or a radial shape. A jet pressure of the cleaning solution may be adjusted such that the particles P on the surface of the substrate W are removed. Maintaining the jet pressure of the cleaning solution at a sufficiently low level may help prevent damage to a circuit pattern on the surface of the substrate W. Maintaining the jet pressure of the cleaning solution at a sufficiently high level may help ensure that the particles P on the surface of the substrate W are removed. The cleaning solution jet 400 may include a plurality of such jet nozzles 410. A plurality of jet nozzles 410 may simultaneously spray the cleaning solution across a larger area. Also, the plurality of jet nozzles 410 may be set to have different jet pressures or may spray different cleaning solutions.

In an implementation, when an acid is used, the cleaning solution may include a combination including any one of sulfuric acid ($H_2SO_4$), hydrochloric acid (HCl), and acetic acid ($CH_3COOH$). In an implementation, when a base is used, the cleaning solution may be a mixture of deionized water and at least one of ammonia water, ammonium hydroxide, and oxygenated water ($H_2O_2$).

The jet nozzles 410 may be connected to a cleaning solution supply pipe that supplies the cleaning solution. The cleaning solution supply pipe may be located in spaces in the jet arm 420 and the jet rod 430. The cleaning solution supply pipe may be connected to a cleaning solution storage container and a pump. The cleaning solution in the cleaning solution storage container may be moved by the pump to the jet nozzles 410 through the cleaning solution supply pipe.

The jet nozzle 410 may be provided at one end of the jet arm 420, and the jet rod 430 may be provided at another end of the jet arm 420. The jet arm 420 may connect the jet nozzle 410 with the jet rod 430. The jet arm 420 may move to adjust a jet position. The cleaning solution supply pipe may be accommodated in the jet arm 420.

The jet rod 430 may support the jet arm 420 to allow the jet nozzle 410 to be located in an area above the substrate support device 100. The cleaning solution supply pipe accommodated in the jet arm 420 may extend and be accommodated in the jet rod 430. The jet rod 430 may include a motor to allow the jet arm 420 to be movable.

The cleaning chamber 300 provides a space capable of accommodating the housing 200. A discharge pipe 330 and a discharge valve 340 connected to the discharge pipe 330 may be formed at a bottom of the cleaning chamber 300. The cleaning chamber 300 may include a peripheral wall 310 that surrounds the housing 200 and may include an inclined wall 320 that inclines inwardly. The cleaning chamber 300 may have an open top, and the jet nozzle 410 may be located in an open top area. When a scattered cleaning solution comes into contact with the inclined wall 320, the cleaning solution may flow down and inward along the inclined wall. Due to the inclined wall 320, the cleaning solution may be prevented from being scattered and discharged outward.

The discharge pipe 330 may discharge the cleaning solution that flows down along the peripheral wall 310 or the inclined wall 320 and may discharge the cleaning solution which has been used for cleaning the substrate W, to the outside. The discharge valve 340 may control a flow of a cleaning solution in the discharge pipe 330.

Parts (a) of FIGS. 2 to 5 illustrate side cross-sectional views of the substrate support device 100 according to an exemplary embodiment. Parts (b) of FIGS. 2 to 5 illustrate top views of the substrate support device 100 according to an exemplary embodiment.

Figure 2:
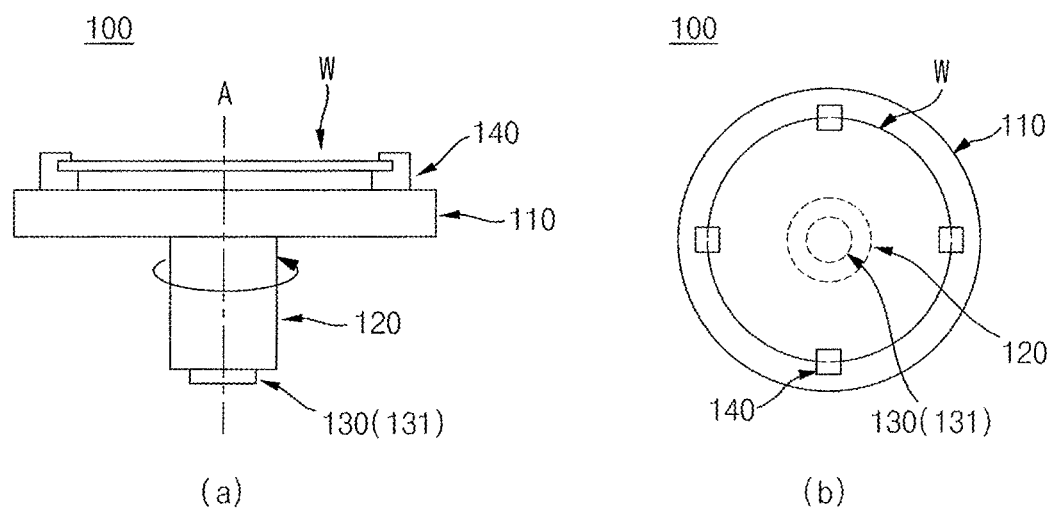

As shown in FIG. 2, the oscillator 130 may include a piezoelectric element 131, and the piezoelectric element 131 may be located on the other surface of the rotor 120. The centers of the support 110, the substrate W, and the oscillator 130 may be located along the rotation axis A (e.g., may vertically coincide or be concentric). Oscillations generated by the piezoelectric element 131 may pass through the rotor 120 and the support 110 and may be transferred to the substrate W.

The center of the piezoelectric element 131 may be located on the rotation axis A, and the substrate W may be precisely oscillated in a perpendicular direction. Also, the piezoelectric element 131 may be located on the other surface (a bottom area) of the rotor 120, and a wire for driving the piezoelectric element 131 or a driver for the piezoelectric element 131 may be easily installed.

Figure 3:
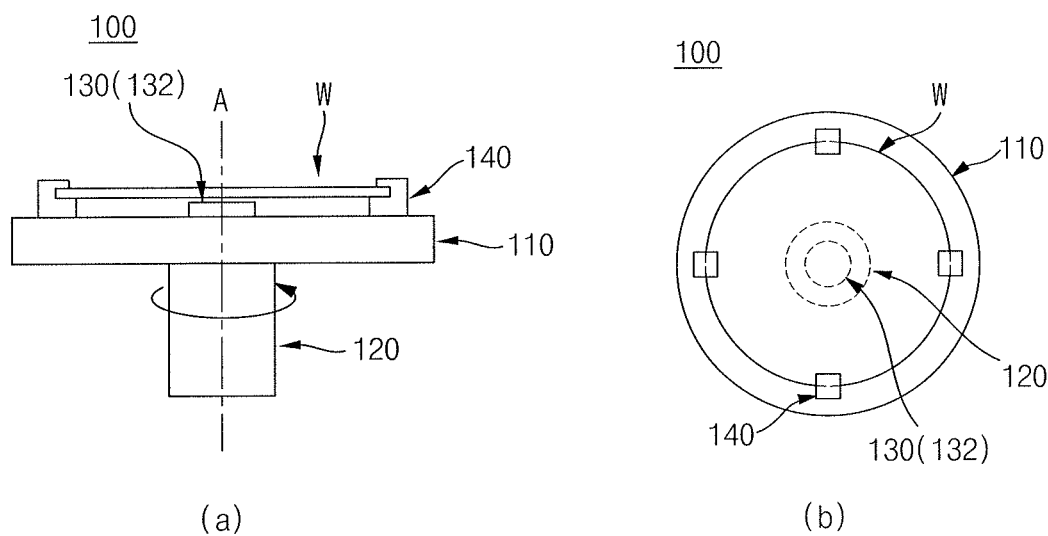

As shown in FIG. 3, the oscillator 130 may include a piezoelectric element 132, and the piezoelectric element 132 may be located on the one surface of the support 110. The centers of the support 110, the substrate W, and the oscillator 130 may be located along the rotation axis A. Oscillations generated by the piezoelectric element 132 may pass through the support 110 and may be transferred to the substrate W.

The center of the piezoelectric element 132 may be located on the rotation axis A, and the substrate W may be precisely oscillated in a perpendicular direction. Also, the piezoelectric element 132 may be located on the one surface of the support 110, and oscillations generated by the piezoelectric element 132 may be directly transferred from the support 110 to the substrate W. Accordingly, the oscillations may be transferred to the substrate W while minimizing a loss of oscillation.

Figure 4:
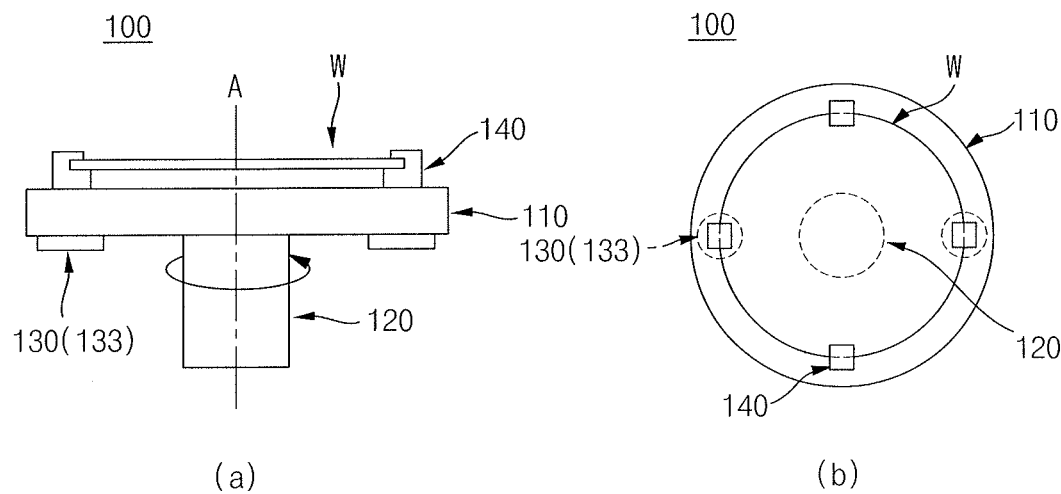

As shown in FIG. 4, the oscillator 130 may include a pair of piezoelectric elements 133 that face each other, and the piezoelectric elements 133 may be located on the other surface of the support 110. The centers of the support 110 and the substrate W may be located along the rotation axis A. Oscillations generated by the piezoelectric element 133 may pass through the support 110 and may be transferred to the substrate W. The pair of piezoelectric elements 133 may face each other with the center of the substrate W interposed therebetween. Also, the pair of piezoelectric elements 133 may be positioned to be spaced equidistantly apart from the center of the support 110.

The pair of piezoelectric elements 133 may face each other with the rotation axis A interposed between, and the oscillations may be uniformly transferred to the support 110 and the substrate W. Also, the pair of piezoelectric elements 133 may be positioned to be spaced equidistantly apart from the center of the support 110, and the oscillations may be precisely transferred to the substrate W in a direction perpendicular to the substrate W. Also, the piezoelectric elements 133 may be located at or on the support 110, and oscillations generated by the piezoelectric elements 133 may be directly transferred from the support 110 to the substrate W. The oscillations may be transferred to the substrate W while minimizing a loss of oscillation. Also, at least two piezoelectric elements 133 may be included, and stronger oscillations may be transferred to the substrate W.

Figure 5:
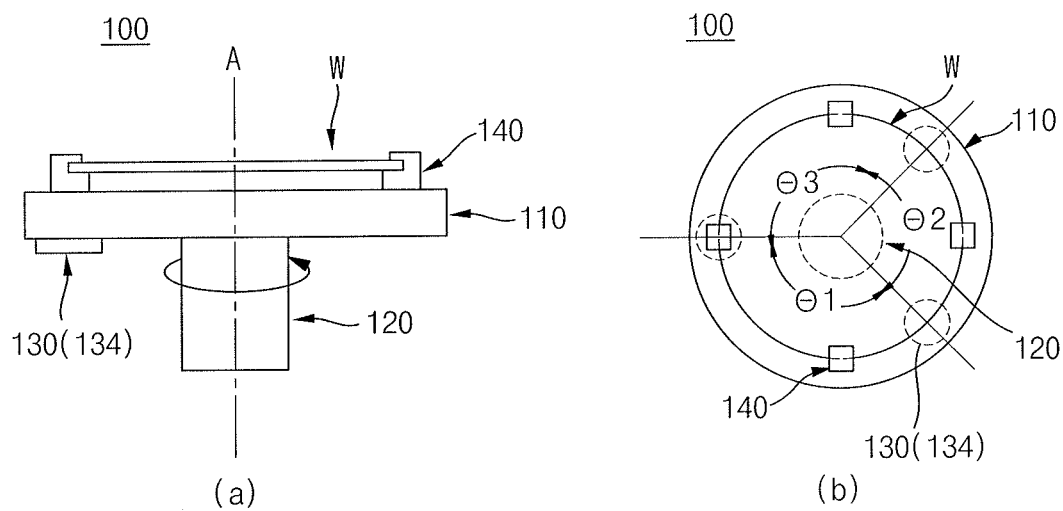

As shown in FIG. 5, the oscillator 130 may include a plurality of piezoelectric elements 134, and the piezoelectric elements 134 may be located on the other surface of the support 110. The centers of the support 110 and the substrate W may be located along the rotation axis A. Oscillations generated by the piezoelectric elements 134 may pass through the support 110 and may be transferred to the substrate W. The piezoelectric elements 134 may be arranged in equal intervals ($\theta1=\theta2=\theta3$) along the perimeter of the substrate W (refer to part (b) of FIG. 5).

The plurality of piezoelectric elements 134 may be spaced apart equidistantly along the perimeter of the substrate W, and the oscillations may be uniformly transferred to the support 110 and the substrate W, and may be precisely transferred to the substrate W in a direction perpendicular to the substrate W. Also, the piezoelectric elements 134 may be located at or on the support 110, and the oscillations generated by the piezoelectric elements 134 may be directly transferred from the support 110 to the substrate W. Accordingly, the oscillations may be transferred to the substrate W while minimizing a loss of oscillation. Also, the plurality of piezoelectric elements 134 may be included, and stronger oscillations may be transferred to the substrate W.

FIG. 6 illustrates side cross-sectional views of the fixer 140 according to an exemplary embodiment.

The fixer 140 may fix (e.g., a position of) the substrate W while the edge of the substrate W is inserted therein during a process of cleaning the substrate W. A plurality of fixers 140 may be installed on or at an edge of the one surface of the support 110. For example, the plurality of fixers 140 may be annularly arranged on the edge of the support 110 along the perimeter of the substrate W.

The fixer 140 may include a concave portion, and the concave portion may include a bottom fixing surface 143, an inner fixing surface 142, and a top fixing surface 141. The bottom fixing surface 143 of the concave portion may come into contact with the other (e.g., bottom) surface of the edge of the substrate W such that the substrate W may be mounted on the bottom fixing surface 143 of the concave portion. The inner fixing surface 142 of the concave portion may come into contact with a side surface of the edge of the substrate W while fixing the substrate W. The top fixing surface 141 of the concave portion may come into contact with the one (e.g., top) surface of the substrate W and may press the substrate W. The concave portion of the fixer 140 may help prevent the perpendicularly oscillating substrate W from being separated from the support 110.

The fixer 140 may linearly reciprocate via a mover to fix the substrate W. In a standby state, the bottom fixing surface 143 of the concave portion may come into contact with the edge of the substrate W (refer to part (a) of FIG. 6). In a cleaning state, the inner fixing surface 142 and the bottom fixing surface 143 of the concave portion may come into contact with the edge of the substrate W (refer to part (b) of FIG. 6). Also, when the substrate W oscillates, the top fixing surface 141 of the concave portion may come into contact with the edge of the substrate W. For example, the mover may horizontally or radially move the fixer 140 to allow the inner fixing surface 142 of the concave portion to come into contact with the edge of the substrate W.

In an implementation, the support 110 according to an exemplary embodiment may be, e.g., an electrostatic chuck. The electrostatic chuck may fix the substrate W using an electrostatic force and may help prevent the substrate W from being separated from the electrostatic chuck by oscillation.

When the substrate W is loaded on the electrostatic chuck and a high voltage is applied to the electrostatic chuck, a potential difference may occur between the substrate W and electrodes of the electrostatic chuck due to the high voltage applied to the electrostatic chuck, e.g., a voltage of DC 650 V to 700 V. Due to the potential difference, a dielectric polarization phenomenon could occur in an insulator that surrounds the electrode. Due to the dielectric polarization phenomenon, an area of the substrate W contiguous to a positive electrode could be negatively charged and an area of the substrate W contiguous to a negative electrode could be positively charged. Due to such electric charges, an electrostatic force may be generated such that the substrate W may be fixed to the electrostatic chuck.

During a process of manufacturing a semiconductor substrate W, particles P that occur (e.g., that are deposited on the substrate W) due to semiconductor equipment, a variety of gases, a chemical solution, deionized water, and the like may contaminate the substrate W.

For example, the particles P attached to or on the surface of the substrate W could cause a defective pattern during a lithography process. Also, the particles P could cause defects such as pinholes and/or microvoids due to dispersion of the particles P in a process of forming a thin film. In an ion implantation process, the particles P could cause a masking defect. The particles P could generate a defect of poor element characteristics by being on a wiring pattern of an element, e.g., interfering with operation of the element. Also, if the number of the particles P were to increase, an insulation breakdown voltage in a gate oxide film could be lowered such that reliability and a yield could decrease.

In the process of manufacturing the semiconductor substrate W, the particles P (which may adversely influence the quality and yield of a semiconductor device) may be removed.

If a cleaning solution is sprayed too strongly while removing the particles P, a micro circuit pattern could be damaged. If the surface of the substrate W were to be thinly etched using a chemical solution to reduce adhesion between the particles P and the surface of the substrate W, a micro circuit pattern could still be damaged.

The substrate support device 100 and the substrate cleaning apparatus according to an exemplary embodiment may perpendicularly move the substrate W such that the adhesion between the substrate W and the particles P may diminish or otherwise be reduced. As a result thereof, the particles P may be effectively removed without damaging a circuit pattern (e.g., removal of the particles P may be facilitated).

FIG. 7 illustrates views briefly showing movements of the substrate W and particles P during oscillation according to an exemplary embodiment.

As shown in parts (a) and (b) of FIG. 7, the substrate W may perpendicularly oscillate due to the oscillator 130. Accordingly, oscillation may pass through the substrate W and may be transferred to the particles P. Due to the oscillation, an upward force may be applied to the substrate W and a downward force may be applied to the particles P relative to the substrate W, according to the law of inertia (refer to part (a) of FIG. 7). In addition, due to the oscillation, a force may be applied downward to the substrate W and may be applied upward to the particles P (refer to part (b) of FIG. 7).

When the above-described oscillation phenomenon repeatedly and periodically occurs, the particles P may be separated from the surface of the substrate W. Accordingly, a contact area between the surface of the substrate W and the particles P may be reduced. When the contact area is reduced, adhesion between the particles P and the substrate W (which is referred to as van der Waals forces) may also be reduced. As the adhesion between the particles P and the substrate W is reduced, the particles P may be easily removed from the surface of the substrate W by movement of the cleaning solution.

A circuit pattern may be formed on the surface of the substrate W to have an uneven form that protrudes in a direction perpendicular to the substrate W, e.g., outwardly or away from the surface of the substrate W. The particles P may be located between uneven parts of the circuit pattern. The oscillation may be perpendicularly transferred to the substrate W, and damage to the circuit pattern may be prevented, unlike in a case in which the oscillation is horizontally or obliquely applied to the substrate W.

In an implementation, the substrate W may oscillate at a natural frequency of the substrate W or a natural frequency of the particles P. When the substrate W oscillates without an external influence, a corresponding oscillation form is referred to as natural oscillation and an oscillation frequency corresponding to the natural oscillation is referred to as a natural frequency.

When the oscillator 130 applies the same oscillation as the natural frequency of the substrate W to the substrate W, a resonance phenomenon may occur at the substrate W. The resonance phenomenon allows diffusion of oscillation energy with respect to the substrate W. As a result thereof, a width of oscillation of the substrate W may be maximized and displacement with respect to bending of the substrate W may also increase. As the displacement with respect to bending of the substrate W increases, the contact area between the surface of the substrate W and the particles P may be reduced. Also, the adhesion of the particles P to the substrate W may also be reduced such that the particles P may be easily removed from the substrate W.

When the oscillator 130 applies the same oscillation as the natural frequency of the particles P to the substrate W, a resonance phenomenon may occur at the particles P. The resonance phenomenon allows diffusion of oscillation energy with respect to the particles P. Accordingly, oscillation displacement of the particles P may be maximized and the contact area between the surface of the substrate W and the particles P may be reduced. As a result thereof, the adhesion of the particles P to the substrate W may also be reduced such that the particles P may be easily removed from the substrate W.

In an implementation, when the resonance phenomenon of the particles P continues, the particles P may be destroyed by the oscillation energy. The oscillator 130 may continuously transfer, to the substrate W, oscillation according to the natural frequency of the particles P until the particles P are destroyed.

A resonance frequency $f_0$ of the natural frequency that causes the resonance phenomenon at the substrate W or the particles P may be defined by the following equation.

Resonance Frequency $f_0 = \frac{1}{2}\pi \cdot \sqrt{(k/m)}$       [Equation 1]

In Equation 1, k refers to an elastic constant of the substrate or the particles, and m refers to a mass of the substrate or the particles.

In an implementation, a resonance frequency $f_0$ band according to an exemplary embodiment may correspond to at least 0.5 times the resonance frequency $f_0$ ($f_0/2$) and no greater than 1.5 times the resonance frequency $f_0$ ($f_0 \cdot 3/2$).

FIG. 8 illustrates a graph showing amplitude of oscillation according to frequency according to an exemplary embodiment. In FIG. 8, the horizontal axis refers to frequency and the vertical axis refers to a level of amplitude.

As seen from FIG. 8, the amplitude may vary in level according to the frequency. In an implementation level of amplitude starts rapidly increasing at a frequency of 0.5 times the resonance frequency $f_0$ and has a maximum value at the resonance frequency $f_0$. The level of amplitude starts rapidly decreasing while passing the resonance frequency $f_0$ at which the level has the maximum value and gradually decreases from a frequency of 1.5 times the resonance frequency $f_0$.

Referring to FIG. 8 for the graph, it may be seen that the level of amplitude corresponding to the resonance frequency $f_0$ band is greater than the levels of amplitude corresponding to other frequency bands excluding the resonance frequency $f_0$ band.

When the oscillator 130 transfers oscillation to the substrate W at the resonance frequency $f_0$ band of the substrate W or the particles P, greater oscillation energy may be applied to the substrate W or the particles P such that the adhesion between the substrate W and the particles P is reduced.

When the substrate W includes $SiO_2$, it may be seen via Equation 1 that the resonance frequency $f_0$ of the natural frequency of the substrate W is about 15.4 kHz. In this case, the resonance frequency $f_0$ band of the substrate W may correspond to at least about 7.7 kHz and no greater than about 23.14 kHz.

FIG. 9 illustrates a view showing displacement of the substrate W when oscillation of about 15.4 kHz is applied, through a simulation, to the substrate W including $SiO_2$.

In FIG. 9, drawings are arranged from a left side to a right side by time lapse. In the drawings, as a shade deepens, the number of appearances of the substrate W increases. Referring to the drawing on the left side, it may be seen that when oscillation is transferred to the substrate W, the substrate W repeatedly bends upward and downward (a lighter part). It may be seen that when the oscillation is continuously transferred to the substrate W, like the drawing on the right side, the number of maximum bending of the substrate W (a darker part in the lighter part) gradually increases. When the oscillation of about 15.4 kHz is transferred to the substrate W, a maximum bending amount of the substrate W may be about 4 μm.

When the particles P include $SiO_2$, the resonance frequency $f_0$ of the natural frequency of the particles P may be about 0.17 kHz. In this case, the resonance frequency $f_0$ band of the particles P may be at least about 0.085 kHz and no greater than 0.255 kHz.

In an implementation, the particles P may include at least one of silicon nitride (SiN) and alumina ($Al_2O_3$).

To generate oscillation according to the resonance frequency $f_0$ of the substrate W or the particles P, a voltage applied to the oscillator 130 may be controlled.

FIG. 10 illustrates a side cross-sectional view of a substrate cleaning apparatus according to an exemplary embodiment. Components that overlap with those in the above-described exemplary embodiment may be simply described or omitted.

In FIG. 10, the substrate cleaning apparatus may include the substrate support device 100, the housing 200, the cleaning chamber 300, and a megasonic device 500.

The megasonic device 500 may perform megasonic cleaning in which cleaning is performed by transferring energy through a fluid. The main mechanism of the megasonic cleaning may be any one of acoustic streaming, micro-cavitation, acoustic pressure gradient, and pressure enhanced chemical effects. Among them, micro-cavitation utilizes the quick formation of microbubbles formed from a gas which is dissolved when acoustic energy is applied to a liquid medium and the bursting of the formed bubbles.

Oscillation may occur due to repeated motion from increasing and decreasing a micro-cavitation size. The particles P present around micro-cavitation may be removed by detachment torque caused by gas/liquid interface sweeping. Also, the particles P present far away may be removed by a pressure-gradient force caused by a surrounding liquid which oscillates due to oscillation cavitation. Micro-cavitation may be applied to the megasonic device 500 according to the embodiment.

The megasonic device 500 may include a cavitation generator 520 and a cleaning solution container 510.

The cleaning solution container 510 may provide a space for accommodating a cleaning solution. The cleaning solution container 510 may include an inlet through which a cleaning is supplied and an outlet through which a cleaning solution and micro-cavitation are discharged to a substrate. The inlet may receive a cleaning solution from a cleaning solution supply. The inlet may be formed at a top surface of the cleaning solution container 510, and the outlet may be formed at a bottom surface of the cleaning solution container 510. The cleaning solution may flow into a top part due gravity and may be discharged toward the substrate W through the outlet at a bottom part.

The cavitation generator 520 may generate micro-cavitation for cleaning the substrate W. The cavitation generator 520 may be disposed to be contiguous to the outlet. For example, the cavitation generator 520 may be disposed at the bottom surface or side of the cleaning solution container 510, and the outlet may be formed at a center of the bottom surface. In an implementation, a position of the cavitation generator 520 may be variously changed in the cleaning solution container 510 as desired.

To stably maintain a sustenance time of the micro-cavitation discharged through the outlet, a diameter or a length of the outlet may be adjusted. Also, a flow rate of the discharged cleaning solution may be adjusted. The flow rate of the cleaning solution, micro-cavitation generation, and the like may vary according to the arrangement of the cavitation generator 520, the inlet, and the outlet.

The substrate W may be cleaned by the cleaning solution and the micro-cavitation discharged through the outlet at a part between the bottom of the cleaning solution container 510 and the substrate W. A gap between the bottom of the cleaning solution container 510 and the substrate W may be filled with the cleaning solution. While the substrate W may not come into direct contact with the outlet, a distance between the bottom of the cleaning solution container 510 and the substrate W may be set to be narrow.

When the distance between the bottom of the cleaning solution container 510 and the substrate W is narrow, a space between the substrate W and the bottom of the cleaning solution container 510 may be filled with the cleaning solution continuously discharged from the outlet without any additional member or device.

The cleaning solution including the micro-cavitation may come into contact with the surface of the substrate W and may move over the surface of the substrate W due to a centrifugal force. At the same time, oscillation according to the natural frequency of the substrate W or the natural frequency of the particles P may be transferred to the substrate W by the oscillator 130 and a resonance phenomenon may occur. Due to the resonance phenomenon, the adhesion between the substrate W and the particles P may be reduced such that the particles P may be easily removed by the cleaning solution.

By way of summation and review, if particles were to be on or attached onto a surface of a mask or a wafer, a defective circuit pattern could be caused in a subsequent operation. Also, if particles were to be present between micro circuit patterns, a malfunction of the semiconductor device could result. As the degree of integration of semiconductor devices increases, the size of a circuit pattern and an interval between circuit patterns may be greatly decreased. Due to this, as the size of a circuit pattern decreases, the size of allowable particles may also decrease. Removing micro-sized particles from a surface of a substrate may be considered. A central part of a cleaning operation of removing particles may relate to how to effectively provide a substrate with a force capable of overcoming a strong adhesion force which acts between particles and the substrate. Accordingly, increasing efficiency of a substrate cleaning operation may be considered.

According to the exemplary embodiments, a substrate support device that removes particles from a substrate without damage of a micro circuit pattern may be provided, and thus a cleaning force of a substrate cleaning apparatus may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A support device for a substrate, the device comprising:
a support on which the substrate is loadable;
a rotor that is disposed on a lower surface of the support and rotates the support;
an oscillator that is configured to oscillate the substrate only in a direction perpendicular to a surface of the substrate; and
a fixing member that fixes the substrate and is disposed on an edge of an upper surface of the support,
wherein the oscillator is configured to oscillate the substrate at a natural frequency of particles on the substrate,
wherein the oscillator is disposed between the support and the substrate, and
wherein a height of the oscillator is smaller than a height of the fixing member.

2. The support device as claimed in claim 1, wherein:
a resonance frequency $f_0$ of the natural frequency is defined by Equation 1 below,
the oscillator is configured to oscillate the substrate at a resonance frequency band of 0.5 times the resonance frequency to 1.5 times the resonance frequency, $$\text{Resonance Frequency } f_0 = \frac{1}{2\pi} \cdot \sqrt{(k/m)}, \text{ and} \quad \text{[Equation 1]}$$

in Equation 1, k refers to an elastic constant of the particles on the substrate, and m refers to a mass of the particles on the substrate.

3. The support device as claimed in claim 2, wherein the oscillator is configured to oscillate the substrate at the resonance frequency.

4. The support device as claimed in claim 1, wherein:
the particles on the substrate include $SiO_2$, and
the oscillator is configured to oscillate the substrate at a frequency band of 0.085 kHz to 0.255 kHz.

5. The support device as claimed in claim 4, wherein the oscillator is configured to oscillate the substrate at a frequency of 0.17 kHz.

6. The support device as claimed in claim 1, wherein:
the rotor rotates the support about a rotation axis that vertically coincides with a center of the substrate, and
a center of the oscillator vertically coincides with the rotation axis.

7. The support device as claimed in claim 6, wherein:
the support is disposed on one surface of the rotor, and
the oscillator is disposed on another surface of the rotor.

8. The support device as claimed in claim 6, wherein:
the support is disposed on one surface of the rotor, and
the oscillator is disposed on one surface of the support.

9. The support device as claimed in claim 1, wherein:
the oscillator includes a plurality of piezoelectric elements, and
the plurality of piezoelectric elements are arranged at equidistant intervals along a perimeter of the support.

10. The support device as claimed in claim 1, wherein:
the oscillator includes at least one pair of piezoelectric elements, and
the at least one pair of piezoelectric elements face each other with a center of the support interposed therebetween.

11. A substrate cleaning apparatus, comprising:
a substrate support device on which a substrate is supportable;
a cleaning chamber that provides a space in which the substrate support device is accommodated; and
a cleaning solution jet that sprays a cleaning solution toward the substrate,
wherein the substrate support device includes:
a support on which the substrate is loadable;
a rotor that is disposed on a lower surface of the support and rotates the support;
a plurality of oscillators that are configured to oscillate the substrate only in a direction perpendicular to a surface of the substrate at a natural frequency of particles on the substrate; and
a fixing member that fixes the substrate and is disposed on an edge of an upper surface of the support, wherein the plurality of oscillators are disposed on the lower surface of the support and are arranged in equal intervals along the perimeter of the lower surface of the support.

12. The substrate cleaning apparatus as claimed in claim 11, wherein:
a resonance frequency $f_0$ of the natural frequency is defined by Equation 1 below,
the oscillator is configured to oscillate the substrate at a resonance frequency band of 0.5 times the resonance frequency to 1.5 times the resonance frequency, Resonance Frequency $f_0 = \frac{1}{2\pi} \cdot \sqrt{(k/m)}$, and [Equation 1]

in Equation 1, k refers to an elastic constant of the particles on the substrate, and m refers to a mass of the particles on the substrate.

13. The substrate cleaning apparatus as claimed in claim 12, wherein the oscillator is configured to oscillate the substrate at the resonance frequency.

14. The substrate cleaning apparatus as claimed in claim 11, wherein the cleaning solution jet includes:
a jet nozzle that sprays the cleaning solution toward the substrate;
a jet arm that includes the jet nozzle at one end thereof; and
a jet rod that supports the jet arm.

15. A substrate cleaning apparatus, comprising:
a substrate support device on which a substrate is supportable;
a cleaning chamber that provides a space in which the substrate support device is accommodated; and
a megasonic device that provides a cleaning solution including micro-cavitation toward the substrate and is disposed above the substrate, the megasonic device including a cleaning solution container and a cavitation generator disposed at a bottom surface of the cleaning solution container,
wherein the substrate support device includes:
a support on which the substrate is loadable;
a rotor that is disposed on a lower surface of the support and rotates the support; and
an oscillator that is configured to oscillate the substrate only in a direction perpendicular to a surface of the substrate at a natural frequency of particles on the substrate,
wherein the cleaning solution container provides a space for accommodating a cleaning solution, and
wherein the cavitation generator creates a micro-cavitation for cleaning the substrate and has an outlet for discharging the cleaning solution and the micro-cavitation to the substrate.

16. The substrate cleaning apparatus as claimed in claim 11, wherein:
a resonance frequency $f_0$ of the natural frequency is defined by Equation 1 below, and
the oscillator is configured to oscillate the substrate at a resonance frequency band of 0.5 times the resonance frequency to 1.5 times the resonance frequency, Resonance Frequency $f_0 = \frac{1}{2\pi} \cdot \sqrt{(k/m)}$, and [Equation 1]

in Equation 1, k refers to an elastic constant of the particles on the substrate, and m refers to a mass of the particles on the substrate.

17. The substrate cleaning apparatus as claimed in claim 16, wherein the oscillator is configured to oscillate the substrate at the resonance frequency.

18. The substrate cleaning apparatus as claimed in claim 15, wherein the megasonic device includes:
a cleaning solution container in which the cleaning solution flows in through an inlet and is sprayed toward the substrate through an outlet; and
a cavitation generator that is contiguous to the outlet and generates the micro-cavitation in the cleaning solution.

\* \* \* \* \*